(12) United States Patent
Yamanaka et al.

(10) Patent No.: US 10,607,689 B2
(45) Date of Patent: *Mar. 31, 2020

(54) APPARATUSES AND METHODS FOR PROVIDING DRIVING SIGNALS IN SEMICONDUCTOR DEVICES

(71) Applicant: MICRON TECHNOLOGY, INC., Boise, ID (US)

(72) Inventors: Satoshi Yamanaka, Kokubunji (JP); Tetsuaki Okahiro, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/416,059

(22) Filed: May 17, 2019

(65) Prior Publication Data

US 2019/0272866 A1 Sep. 5, 2019

Related U.S. Application Data

(63) Continuation of application No. 15/881,200, filed on Jan. 26, 2018, now Pat. No. 10,347,321.

(51) Int. Cl.
| | | |
|---|---|---|
| *G11C 11/40* | (2006.01) | |
| *G11C 11/4091* | (2006.01) | |
| *G11C 11/4074* | (2006.01) | |
| *G11C 11/408* | (2006.01) | |
| *G11C 8/14* | (2006.01) | |
| *G11C 5/02* | (2006.01) | |
| *G11C 8/08* | (2006.01) | |
| *G11C 8/12* | (2006.01) | |

(52) U.S. Cl.
CPC .......... *G11C 11/4091* (2013.01); *G11C 5/025* (2013.01); *G11C 8/08* (2013.01); *G11C 8/12* (2013.01); *G11C 8/14* (2013.01); *G11C 11/4074* (2013.01); *G11C 11/4085* (2013.01); *G11C 11/4087* (2013.01)

(58) Field of Classification Search
CPC .......... G11C 11/4091; G11C 11/4074
See application file for complete search history.

(56) References Cited

U.S. PATENT DOCUMENTS

| | | | |
|---|---|---|---|
| 2008/0123463 A1* | 5/2008 | Matsubara | G11C 8/08 365/230.06 |
| 2010/0046275 A1* | 2/2010 | Hosono | G11C 5/02 365/148 |
| 2017/0178751 A1 | 6/2017 | Choi | |

OTHER PUBLICATIONS

U.S. Appl. No. 15/881,200, filed Jan. 26, 2018 entitled 'Apparatuses and Methods for Providing Driving Signals in Semiconductor Devices'.

* cited by examiner

*Primary Examiner* — Mohammed A Bashar
(74) *Attorney, Agent, or Firm* — Dorsey & Whitney LLP (57) ABSTRACT

Apparatuses and methods for providing driving signals in semiconductor devices are described. An example apparatus includes a plurality of memory cell mats including a plurality of word lines and a word line driver coupled to the plurality of word lines of the plurality of memory cell mats. The word line driver is configured, responsive to a row active command, to provide a first voltage to a selected word line of the plurality of word lines of a selected memory cell mat of the plurality of memory cell mats, provide a second voltage different from the first voltage to each of unselected word lines of the plurality of the word lines of the selected memory cell mats of the plurality of memory cell mats, and provide no voltage to each of the plurality of word lines of each of unselected memory cell mats of the plurality of memory cell mats.

20 Claims, 11 Drawing Sheets

APPARATUSES AND METHODS FOR PROVIDING DRIVING SIGNALS IN SEMICONDUCTOR DEVICES

CROSS-REFERENCE TO RELATED APPLICATION

This application is a continuation of U.S. patent application Ser. No. 15/881,200, filed Jan. 26, 2018 and issued as U.S. Pat. No. 10,347,321 on Jul. 9, 2019. This application and patent are incorporated by reference herein in their entirety and for all purposes.

BACKGROUND

A semiconductor memory device represented by a DRAM (Dynamic Random Access Memory) includes a memory cell array having memory cells disposed at intersections between subword lines and bit lines. The semiconductor memory device may include hierarchically structured main word lines and subword lines. The main word line is a word line positioned at an upper hierarchy, and is selected by a first portion of a row address. The subword line is a word line positioned at a lower hierarchy, and is selected based on a corresponding main word line and a word driver line selected by a second portion of the row address.

A memory cell array included in a semiconductor memory device such as the DRAM may be divided into a plurality of memory mats to reduce the wiring capacity of the subword line and the bit line. The memory mat refers to an extending range of the subword line and the bit line. The main word line described above is assigned in plurals to one memory mat, so that when the main word line is selected using the first portion of the row address, the memory mat to be selected is also determined at the same time.

The driving process of the subword lines is carried out by subword drivers, and when the subword line is driven to an active potential, the memory cell is connected to the corresponding bit line. On the other hand, during a period in which the subword line is driven to a non-active potential, the memory cell and the bit line are kept in a cut-off state.

In driving subword lines to the active potential, relatively high voltages are provided to the subword drivers of a memory mat. In contrast, in driving the subword line to a non-active potential, relatively low voltages are provided to the subword drivers of the memory mat. The relatively low voltages that are provided while the subword lines are driven to the non-active potential establishes a condition for transistors of the subword drivers that may result in leakage currents. For example, the relatively low voltage provided to a source of a transistor of the subword driver while a relatively high voltage is provided to a gate of the transistor and a relatively low voltage is provided to the drain of the transistor may result in voltage differences sufficient to induce leakage currents in the transistor. An example of leakage currents may be gate induced drain leakage (GIDL).

Leakage currents increase power consumption by a semiconductor memory device. In systems where low power consumption is important, leakage currents may cause unacceptable power consumption. Therefore, reducing leakage currents in semiconductor memory devices may be desirable.

DETAILED DESCRIPTION

Certain details are set forth below to provide a sufficient understanding of examples of various embodiments of the disclosure. However, it will be clear to one having skill in the art that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
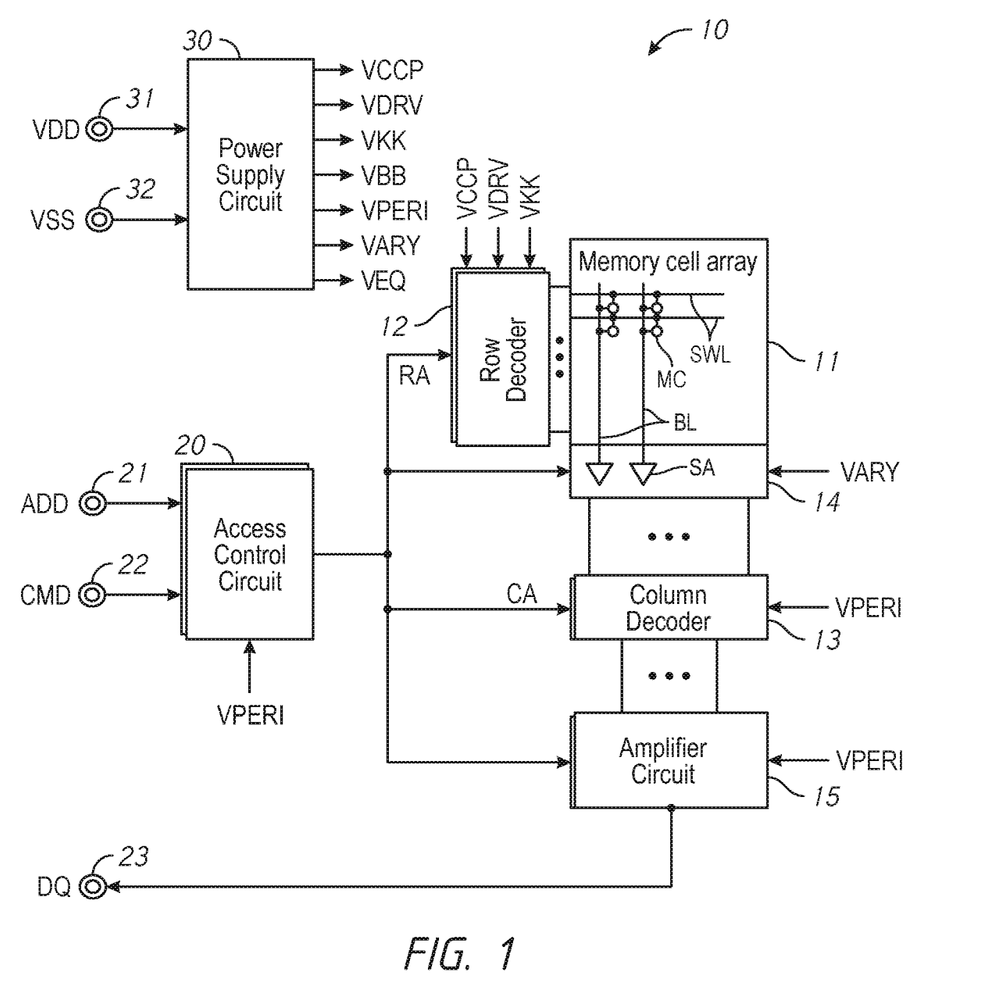
FIG. 1 is a block diagram of a semiconductor device according to an embodiment of the disclosure.

FIG. 1 is a block diagram of a semiconductor device 10 according to an embodiment of the disclosure. The semiconductor device 10 may be a dynamic random access memory (DRAM) in some embodiments of the disclosure. The semiconductor device 10 includes a memory cell array 11. The memory cell array 11 includes a plurality of subword lines SWL and a plurality of bit lines BL that intersect with each other, with memory cells disposed at the intersections. The memory cell array 11 further includes a plurality of main word lines MWL. The selection of a main word line MWL and subword line SWL is carried out by a row decoder 12, and the selection of the bit line BL is carried out by a column decoder 13. Each of the bit lines BL is connected to a corresponding sense amplifier SA inside a sense circuit 14, and the bit line BL selected by the column decoder 13 is connected to an amplifier circuit 15 through the sense amplifier SA.

The operations of the row decoder 12, the column decoder 13, the sense circuit 14 and the amplifier circuit 15 are controlled by an access control circuit 20. An address signal ADD and a command signal CMD are externally supplied respectively through an address terminal 21 and a command terminal 22 to the access control circuit 20. The access control circuit 20 receives the address signal ADD and the command signal CMD, and based upon these, controls the operations of the row decoder 12, the column decoder 13, the sense circuit 14 and the amplifier circuit 15.

More specifically, in the case when the command signal CMD indicates an active command, the address signal ADD (row address RA) is supplied to the row decoder 12. In response to this, the row decoder 12 selects a main word line MWL and subword line SWL indicated by the row address RA so that the associated memory cell MC is subsequently connected to the bit line BL. Thereafter, the access control circuit 20 activates the sense circuit 14.

On the other hand, in the case when the command signal CMD indicates a read command or a write command, the address signal ADD (column address CA) is supplied to the column decoder 13. In response to this, the column decoder 13 connects the bit line BL indicated by the column address CA to the amplifier circuit 15. With this arrangement, at the time of a reading operation, read data DQ read from the memory array 11 are externally output from a data terminal 23 through the amplifier 15. Moreover, at the time of a writing operation, read data DQ externally supplied through the data terminal 23 are written in the memory cell MC through the amplifier circuit 15 and the sense amplifier SA.

These circuit blocks respectively use internal voltages as operation power supplies. These internal power supplies are generated by a power supply circuit 30 shown in FIG. 1, The power supply circuit 30 receives an external potential VDD and a ground potential VSS respectively supplied thereto through power supply terminals 31 and 32, and based upon these, generates internal potentials VCCP, VDRV, VKK, VBB, VPERI, VARY, VEQ and the like.

The internal potentials VCCP, VDRV, and VKK are potentials to be mainly used in the row decoder 12. Although the detailed description thereof will be given later, the row decoder 12 drives the main word line MWL and subword line SWL selected based upon the address signal ADD to a VCCP level corresponding to a high potential so that the cell transistor contained in the memory cell MC is turned on.

The internal potential VARY and VEQ is a potential to be used in the sense circuit 14. When the sense circuit 14 is activated, the read data read out is amplified by driving one of the paired bit lines to a VARY level with the other one being driven to a VSS level. The internal potential VPERI is used as a power supply potential for most of the peripheral circuits, such as the access control circuit 20 or the like. By using the internal potential VPERI having a lower potential than the external potential VDD as the power supply potential of these peripheral circuits, it may be possible to reduce power consumption of the semiconductor device 10.

Figure 2:
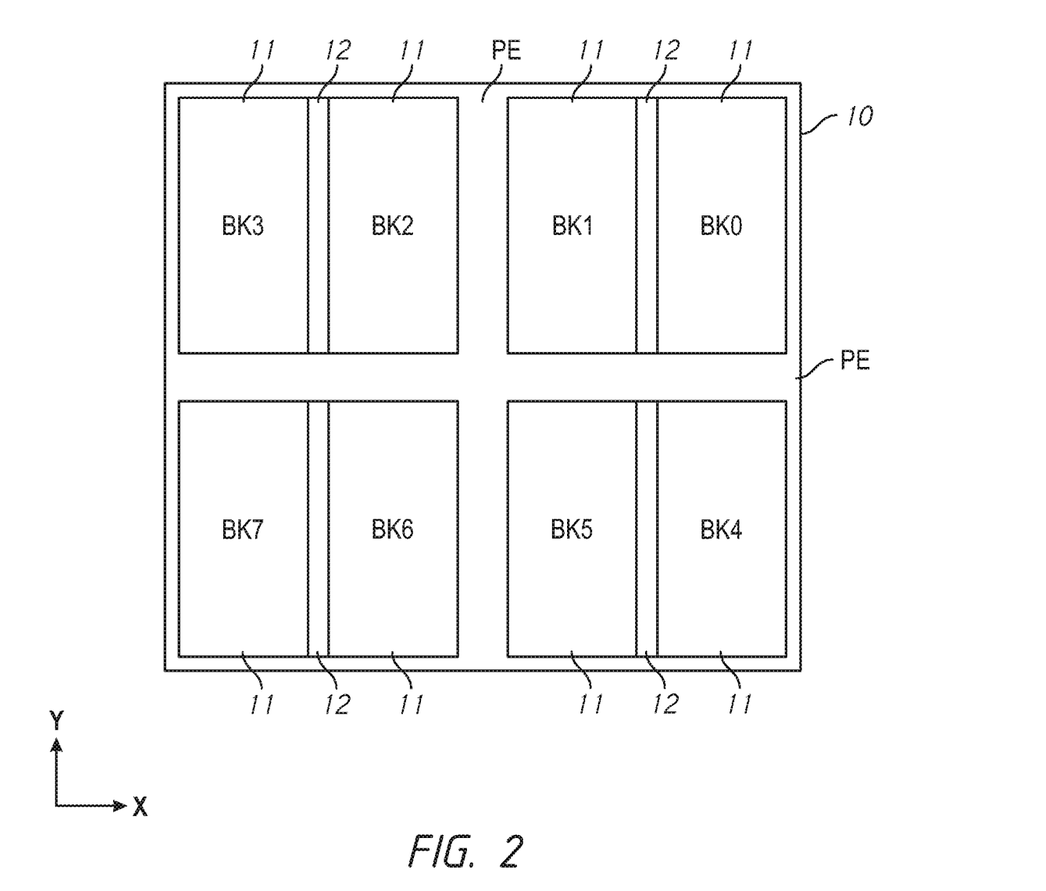
FIG. 2 is a diagram for a layout of the semiconductor device of FIG. 1 according to an embodiment of the disclosure.

FIG. 2 is a diagram for a layout of the memory cell array of the semiconductor device 10 according to an embodiment of the disclosure.

The memory cell array of the present embodiment is divided into eight banks 11 BK0 to BK7. The row decoder 12 is disposed between two banks 11 that are adjacent in the X direction. On the other peripheral circuit region PE, various peripheral circuits and external terminals as shown in FIG. 1 are disposed.

Figure 3:
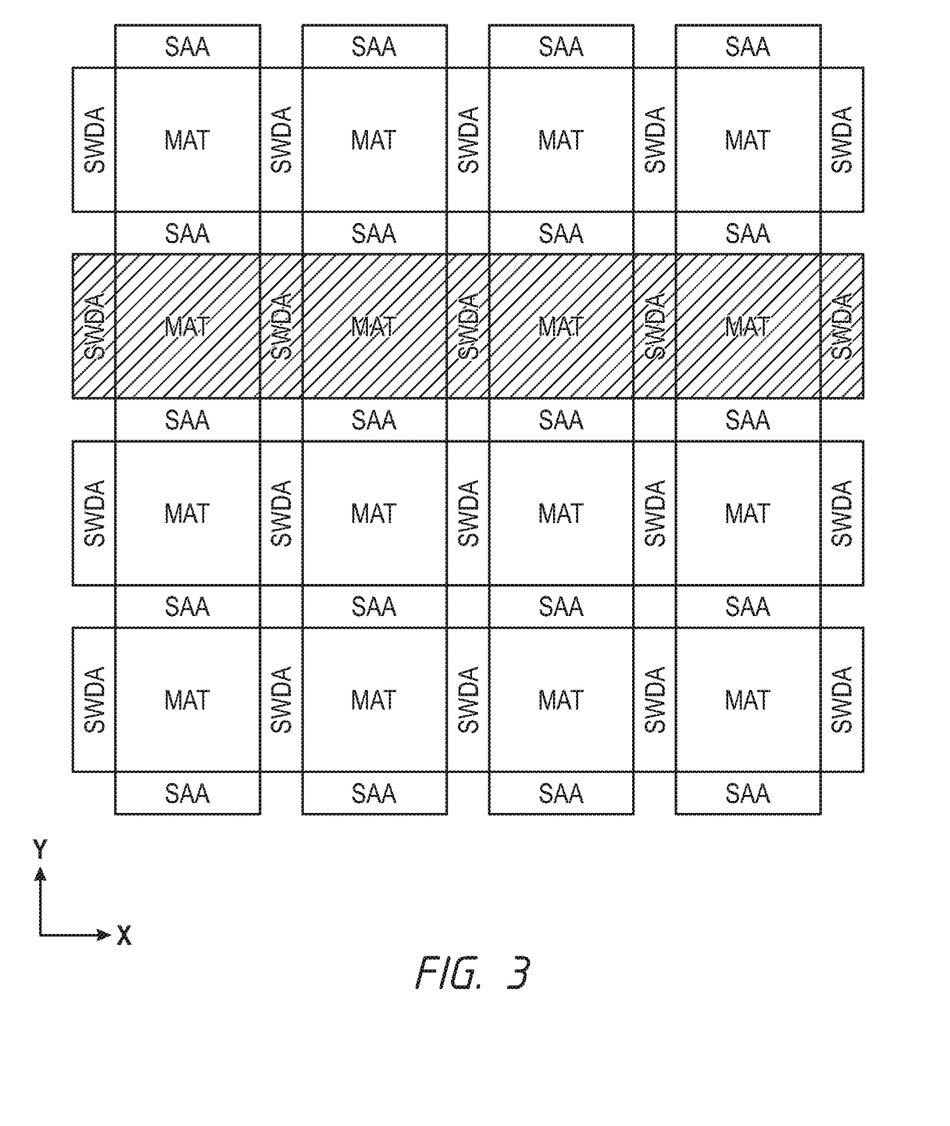
FIG. 3 is a diagram for a configuration of a bank of the memory cell array of the semiconductor device of FIG. 1 according to an embodiment of the disclosure.

FIG. 3 is a diagram for a configuration of a bank BK of the memory cell array of the semiconductor device 10 according to an embodiment of the disclosure. The banks BK0 to BK7 of FIG. 2 may each include the configuration of FIG. 3 in some embodiments of the disclosure.

As shown in FIG. 3, the bank BK includes a plurality of memory mats MAT laid out in a matrix. Moreover, subword driver rows SWDA are formed on the two sides in the X direction of each memory mat MAT, and sense amplifier rows SAA are formed on the two sides in the Y direction of each memory mat MAT.

On the subword driver row SWDA, a plurality of subword drivers, which will be described later, are disposed, and their operations are controlled by the row decoder 12. When a row address RA is inputted thereto, the row decoder 12 selects by way of a selected main word line MWL the plural subword driver rows SWDA that are aligned in the X direction (that is, having the same Y coordinate value). For example, in FIG. 3, when the plural subword driver rows SWDA indicated by hatched lines are selected, memory mats MAT with hatched lines are selected by a corresponding main word line MWL. In this case, all the other memory mats MAT are non-selection.

Moreover, a plurality of sense amplifiers SA are disposed on a sense amplifier row SAA, and the sense amplifiers SA selected by the column decoder 13 are connected to the amplifier circuit 15 shown in FIG. 1.

Figure 4:
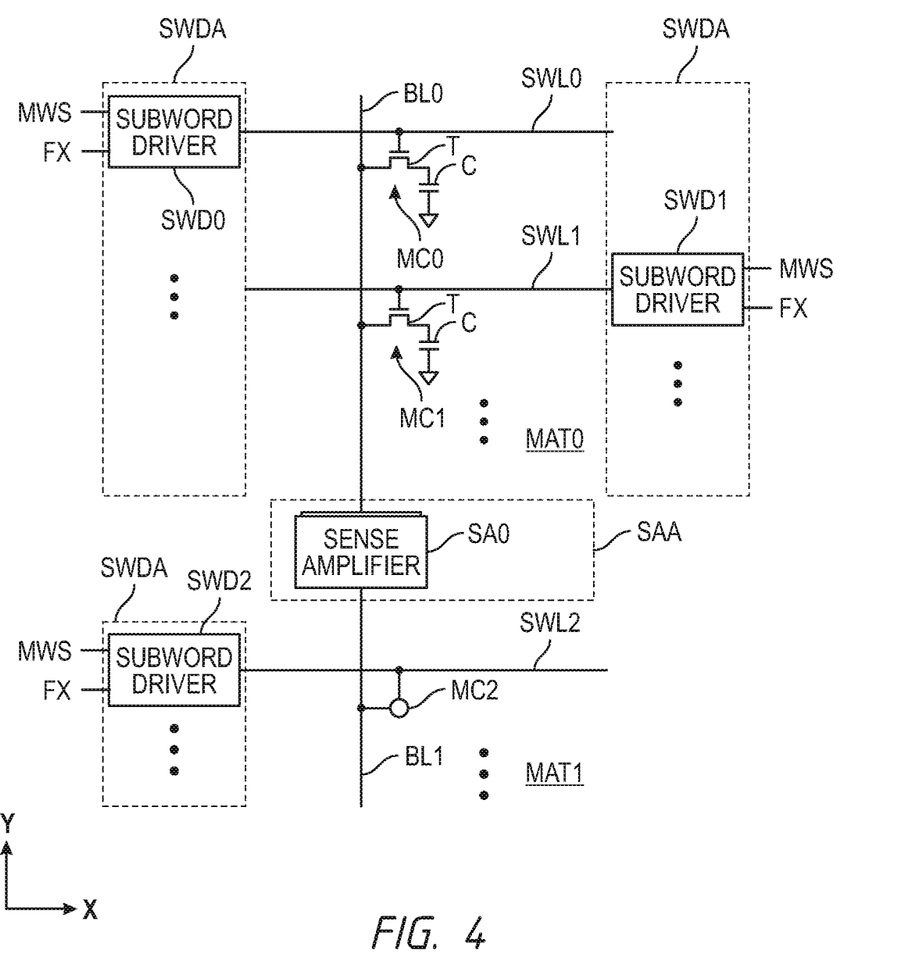
FIG. 4 is a schematic diagram of a portion of the bank of FIG. 3 according to an embodiment of the disclosure.

FIG. 4 is a schematic diagram of a portion of the bank BK of FIG. 3 according to an embodiment of the disclosure.

FIG. 4 shows one portion of memory mats MAT0 and MAT1 that are adjacent in the Y direction. As shown in FIG. 4, in each of the memory mats MAT0 and MAT1, the subword lines SWL extend in the X direction and the bit lines BL extend in the Y direction. Additionally, in FIG. 4, two subword lines SWL0 and SWL1 formed in the memory mat MAT0 and one bit line BL0, as well as one subword line SWL2 and one bit line BL1 formed in the memory mat MAT1, are shown.

The subword lines SWL0 and SWL1 are formed so as to be adjacent to each other, and driven by subword drivers SWD0 and SWD1 formed on different subword driver rows SWDA. To these subword drivers SWD, corresponding main word signal MWS, driving signals FX and non-active potential VKK are supplied. The main word signal MWS and the driving signals FX are signals generated by the row decoder 12 based upon the row address RA. As will be described below, the driving signals FX include complementary signals FX and FXF. The main word signal MWS is provided to the subword drivers SWD0 and SWD1 over a main word line MWL, and the driving signals FX are provided to the subword drivers SWD0 and SWD1 over word driver lines. A main word line MWL may extend over array regions of a respective memory mat to provide the MWS signal to the subword driver rows SWDA of the memory mat to activate the subword drivers SWD of the memory mat. Subword drivers for memory mats of a memory cell array may be included in a word line driver that is coupled to word lines (e.g., subword lines) of the memory mats.

Moreover, the bit line BL0 and the bit line BL1 are connected to the same sense amplifier SA0. That is, the semiconductor device 10 has a so-called open bit line structure. However, embodiments of the disclosure are not limited to having the open bit line structure, and may have another structure. For example, some embodiments of the disclosure have a folded bit line structure.

The sense amplifier SA0 has a function for amplifying the potential difference between the bit line BL0 and the bit line BL1. For example, in the case when the subword line SWL0 is selected, since the potential of the bit line BL0 is changed by a charge held in the memory cell MC0, this change can be detected by using the bit line BL1 as a reference potential. The memory cell MC has a configuration in which a cell transistor T and a cell capacitor C are series-connected. In this case, the memory cells MC0 and MC1, shown in FIG. 4, share the bit line BL0, and are memory cells respectively selected by the adjacent subword lines SWL0 and SWL1.

Figure 5:
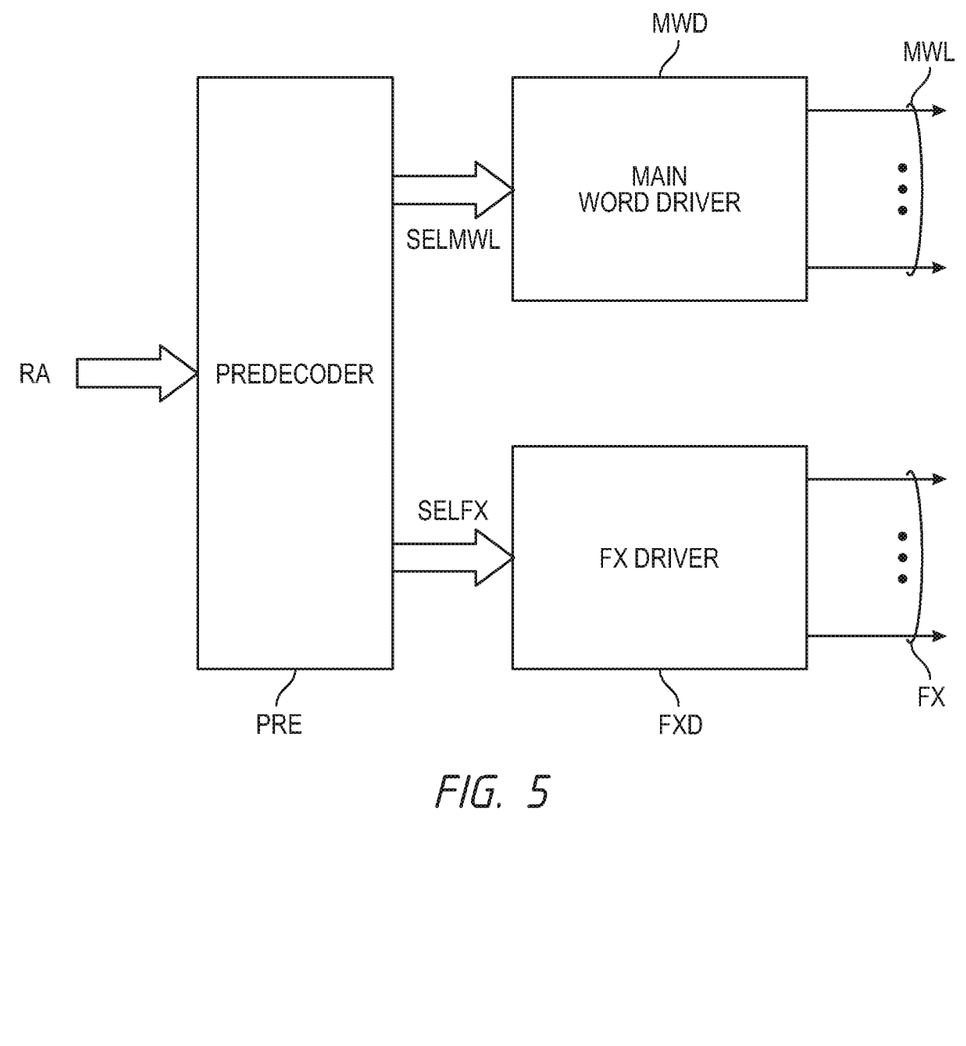
FIG. 5 is a block diagram of a portion of the row decoder according to an embodiment of the disclosure.

FIG. 5 is a block diagram of a portion of the row decoder 12 according to an embodiment of the disclosure. The row decoder 12 includes a predecoder PRE that receives the row address RA, and based on the row address RA, provides selection signals SELMWL and SELFX to a main word driver MWD and driving signal (FX) driver FXD, respectively. The main word driver MWD selects a main word lines MWL based on the selection signals SELMWL and provides an active main word signal MWS to activate subword drivers of a selected memory mat MAT. The FX signals are provided to respective subword drivers and the FX driver FXD selects a word driver line based on the selection signals SELFX and provides active driving signals FX and FXF to activate a subword driver corresponding to the selection signals SELFX. In this manner, a selected subword line SWL of the selected memory mat MAT is driven to the active potential by the corresponding activated subword driver SWD. The other subword drivers SWD of the selected memory mat MAT drive the respective unselected subword lines SWL to the non-active potential to remain inactive. Subword drivers SWD of unselected memory mats MAT remain deactivated, and the subword lines SWL of the unselected memory mats MAT are not provided a voltage.

Figure 6:
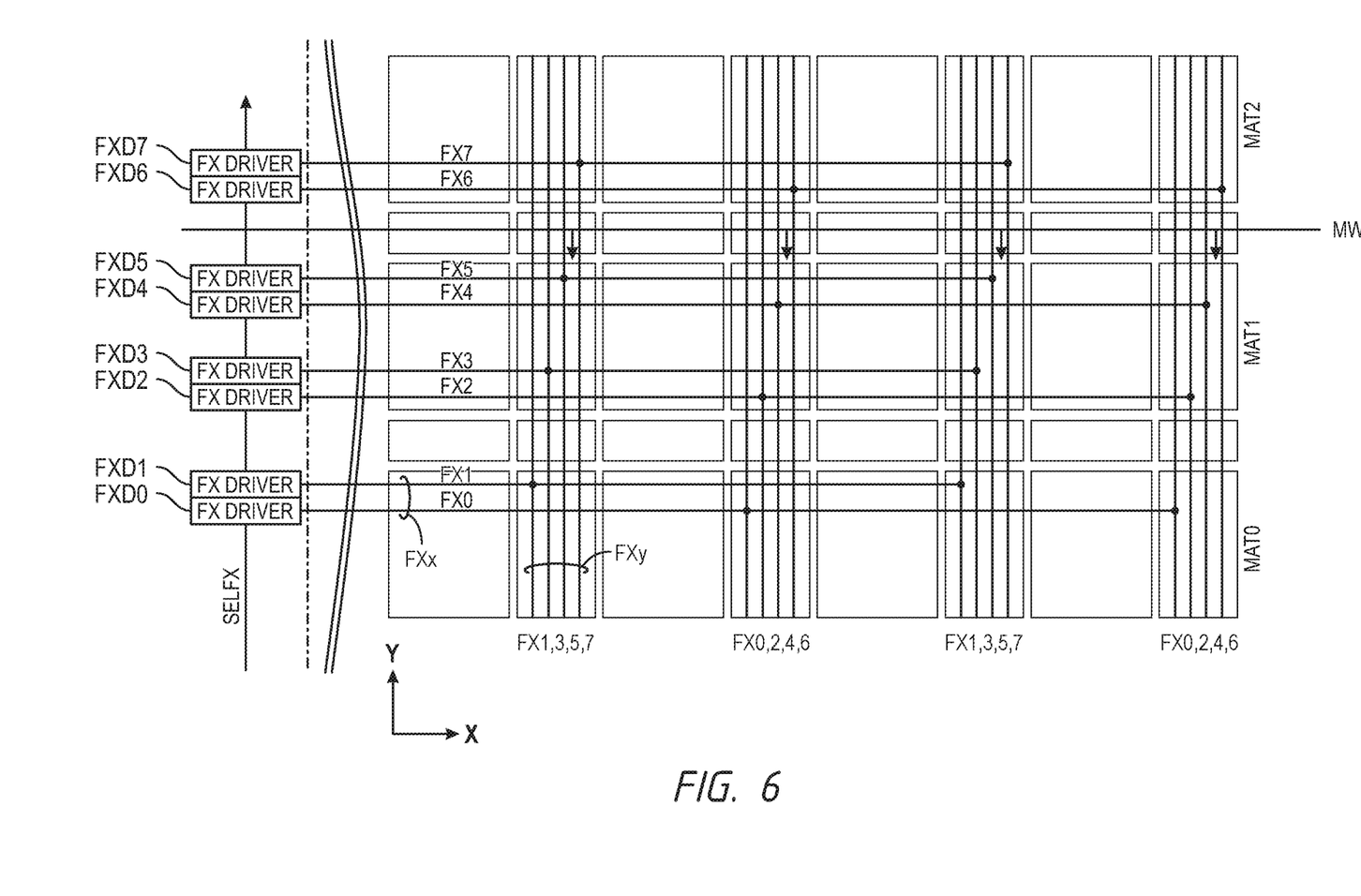
FIG. 6 is a diagram for a layout of word driver lines for a portion of a bank of the memory cell array of the semiconductor device of FIG. 1 according to an embodiment of the disclosure.

FIG. 6 is a diagram for a layout of word driver lines for a portion of a bank BK of the memory cell array according to an embodiment of the disclosure. The layout of word driver lines of FIG. 6 may be used for the banks described in various embodiments of the disclosure.

FIG. 6 illustrates FX drivers FXD0-FXD7 that provide respective driving signals FX and FXF. As previously described, the word driver line FX is a complementary signal, and hence each of the word driver lines FX shown in FIG. 6 include a pair (two) of wirings, one for FX and the other for FXF. The word driver lines FX0 to FX7 are wirings driven by the FX drivers FXD0 to FXD7 included in the row decoder 12, and include a portion FXx extending in the X direction and a portion FXy extending in the Y direction. The portion FXx extending in the X direction is connected to the corresponding FX driver FXD0 to FXD7, and is arranged on the memory mat MAT and the subword driver region SW. The portion FXy extending in the Y direction is alternately arranged by four pairs on the subword driver region SW and the subword cross region SWC. The portion FXy extending in the Y direction is commonly assigned to the memory mats MAT0 to MAT2. In the embodiment of FIG. 6, each word driver line FX0 to FX7 is associated with three memory mats MAT0 to MAT2 arrayed continuously in the Y direction. However, other arrangements of word driver lines may be different than shown in the example of FIG. 6 without departing from the scope of the disclosure.

Figure 7:
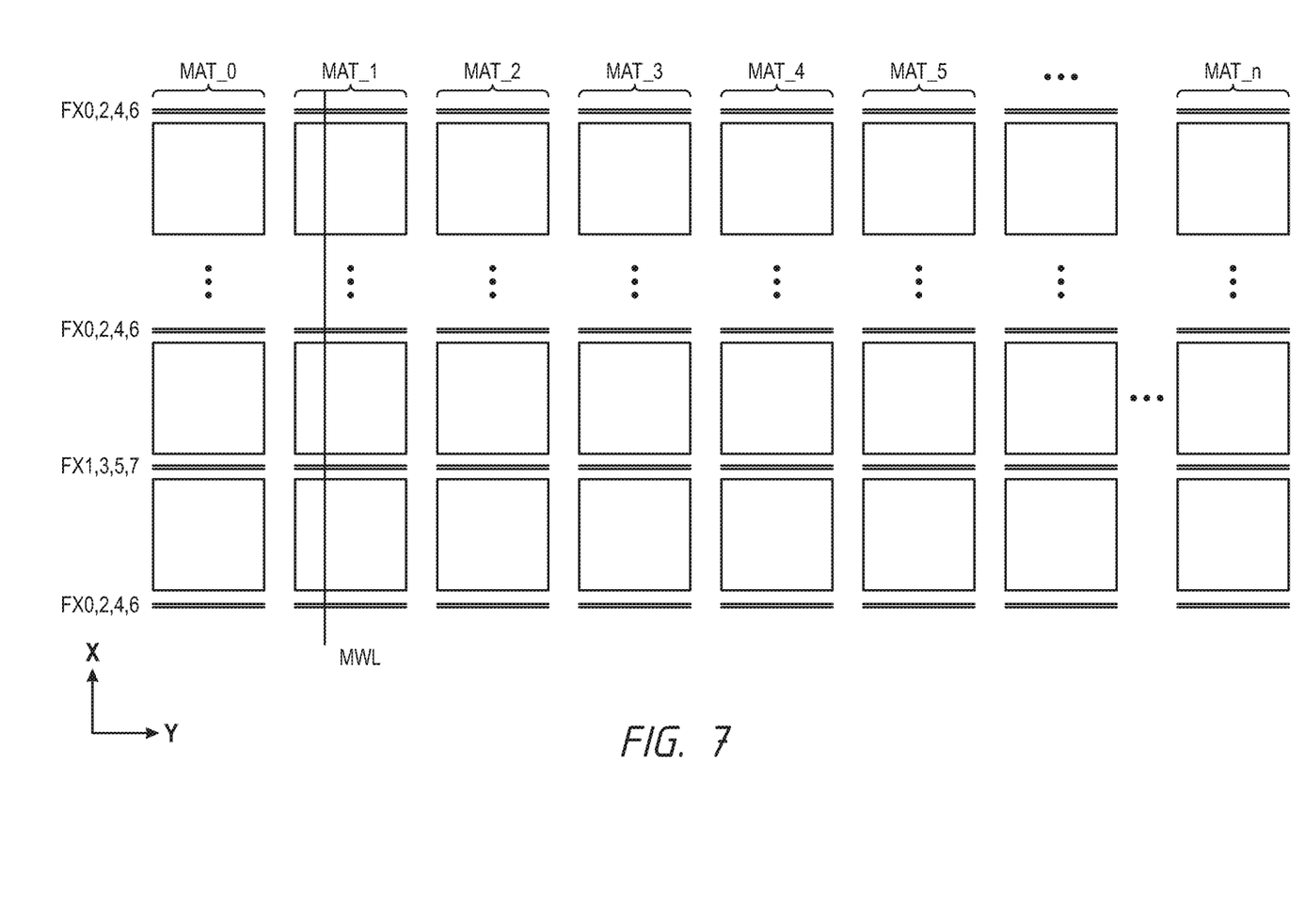
FIGS. 7 and 8 are diagrams for layouts of word driver lines for a portion of a bank of the memory cell array of the semiconductor device of FIG. 1 according to different embodiments of the disclosure.
Figure 8:
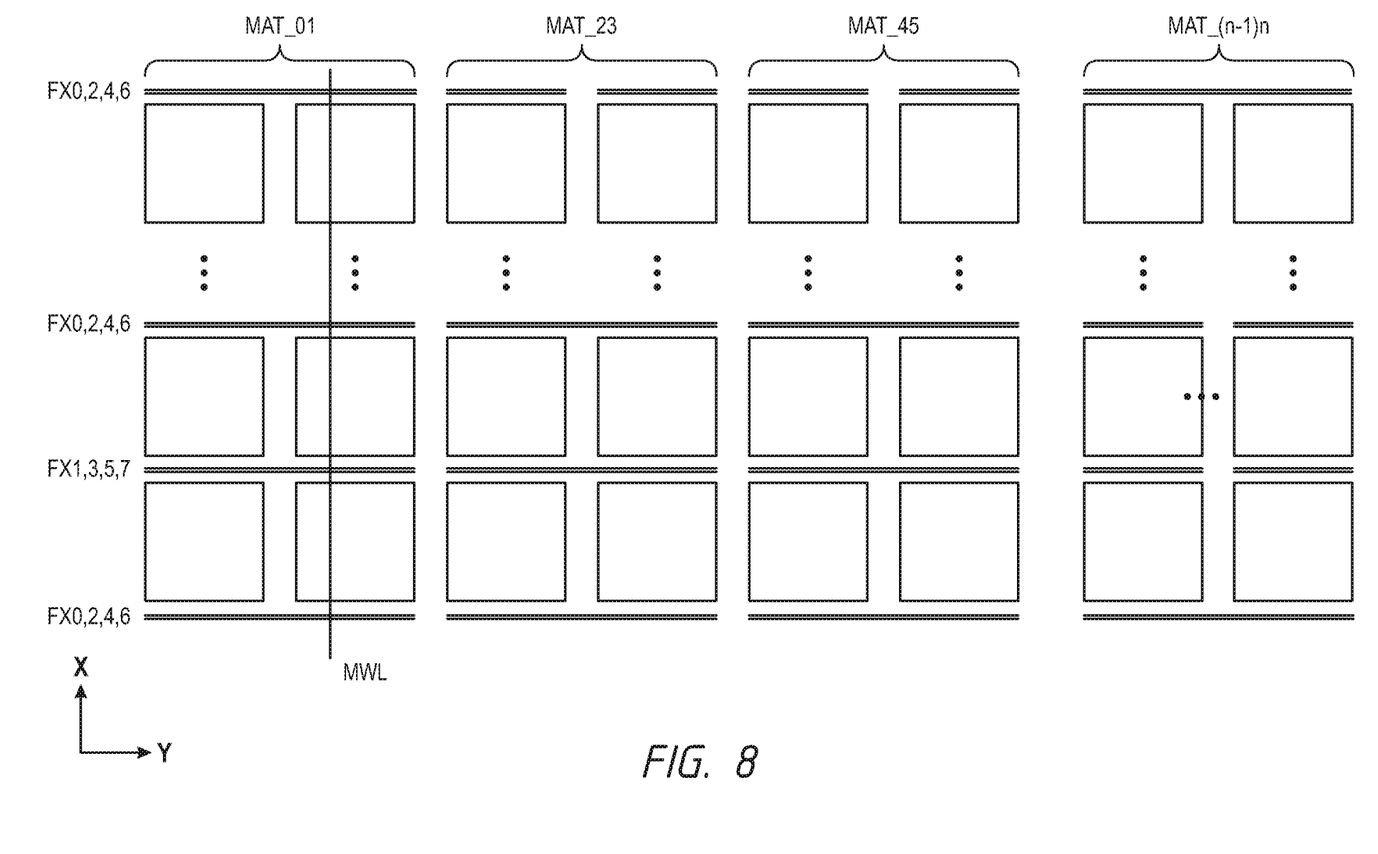

For example, FIGS. 7 and 8 are diagrams for layouts of word driver lines for a portion of a bank BK of the memory cell array according to different embodiments of the disclosure. FIGS. 7 and 8 do not illustrate FX drivers FXD and the portion FXx of the word driver lines, in contrast to FIG. 6. However, memory mats MAT and portions FXy of the word driver lines are illustrated.

FIG. 7 illustrates an embodiment of the disclosure where the memory mats MAT_0 to MAT_n are one array region wide and extend along the Y direction. Disposed between the array regions of adjacent memory mats are sense amplifier rows (not shown in FIG. 7) and disposed between adjacent array regions of a memory mat MAT are plural subword driver rows (not shown in FIG. 7). The word driver lines have portions FXy that are associated with a respective memory mat MAT. For example, each of the memory mats MAT_0 to MAT_n is associated with a respective word driver line portion that extends the width of one array region.

FIG. 8 illustrates an embodiment of the disclosure where the memory mats MAT_01 to MAT_(n−1)n are two array regions wide and extend along the Y direction. Disposed between the array regions of adjacent memory mats are sense amplifier rows (not shown in FIG. 8) and disposed between adjacent array regions of a memory mat MAT are plural subword driver rows (not shown in FIG. 8). The word driver lines have portions FXy that are associated with a respective memory mat MAT. For example, each of the memory mats MAT_01 to MAT_(n−1)n is associated with respective word driver line portion that extends the width of two array regions.

As illustrated by the examples of FIGS. 6, 7, and 8, various layouts of word driver lines for a portion of a bank BK of the memory cell array are within the scope of the disclosure.

Figure 9:
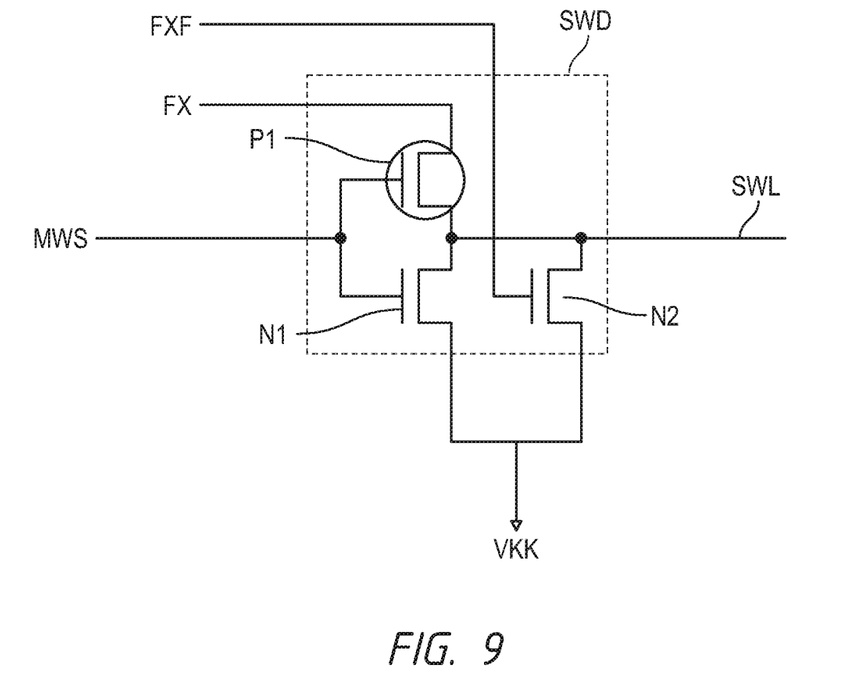
FIG. 9 is a schematic diagram of a subword driver according to an embodiment of the disclosure.

FIG. 9 is a schematic diagram of a subword driver SWD according to an embodiment of the disclosure. The subword driver SWD may be included in the subword drivers SWD previously described in various embodiments of the disclosure.

The subword driver SWD includes a P-channel type MOS transistor P1 and N-channel type MOS transistors N1 and N2. The transistors P1 and N1 are series-connected to each other, and a main word signal MW S is inputted to their gate electrodes. A driving signal FX is supplied to the source of the transistor P1, and the non-active potential VKK is supplied to the source of the transistor N1. Moreover, the drains of the transistors P1 and N1 are connected to subword lines SWL. Furthermore, a driving signal FXF is supplied to the gate electrode of the transistor N2, with its drain being connected to the subword line SWL, and the non-active potential VKK is supplied to its source. As previously described, the main word signal is provided by a main word driver MWD and the driving signals FX and FXF are provided by FX drivers FXD.

The main word signal MWS is a signal that becomes a low level when selected, and the driving signals FX and FXF are signals that respectively become a high level (VCCP level) and the low level (VSS level) when selected. Thus, when the main word signal MWS and the driving signals FX and FXF are activated, the corresponding subword line SWL is driven to the VCCP level that is an active potential. In contrast, in the case when at least one of the main word signal MWS and the driving signals FX and FXF is in the non-activated state, the corresponding subword line SWL is driven to the VKK level that is the non-active potential.

As previously described, when driving subword lines to the active potential, relatively high voltages are provided to the subword drivers of a memory mat by way of the driving signals FX and FXF. In contrast, in driving the subword line to a non-active potential, relatively low voltages are provided to the subword drivers of the memory mat by way of the driving signals FX and FXF. The relatively low voltages that are provided while the subword lines are driven to the non-active potential may establish a condition for transistor P1 that may result in leakage currents. For example, the relatively low voltage provided to the source of the transistor P1 by the driving signal FX while a relatively high voltage is provided to the gate of the transistor P1 by the main word signal MWS, and a relatively low voltage is provided to the drain to the transistor P1 by the subword line SWL may result in voltage differences sufficient to induce leakage currents in the transistor P1, such as GIDL currents.

Figure 10:
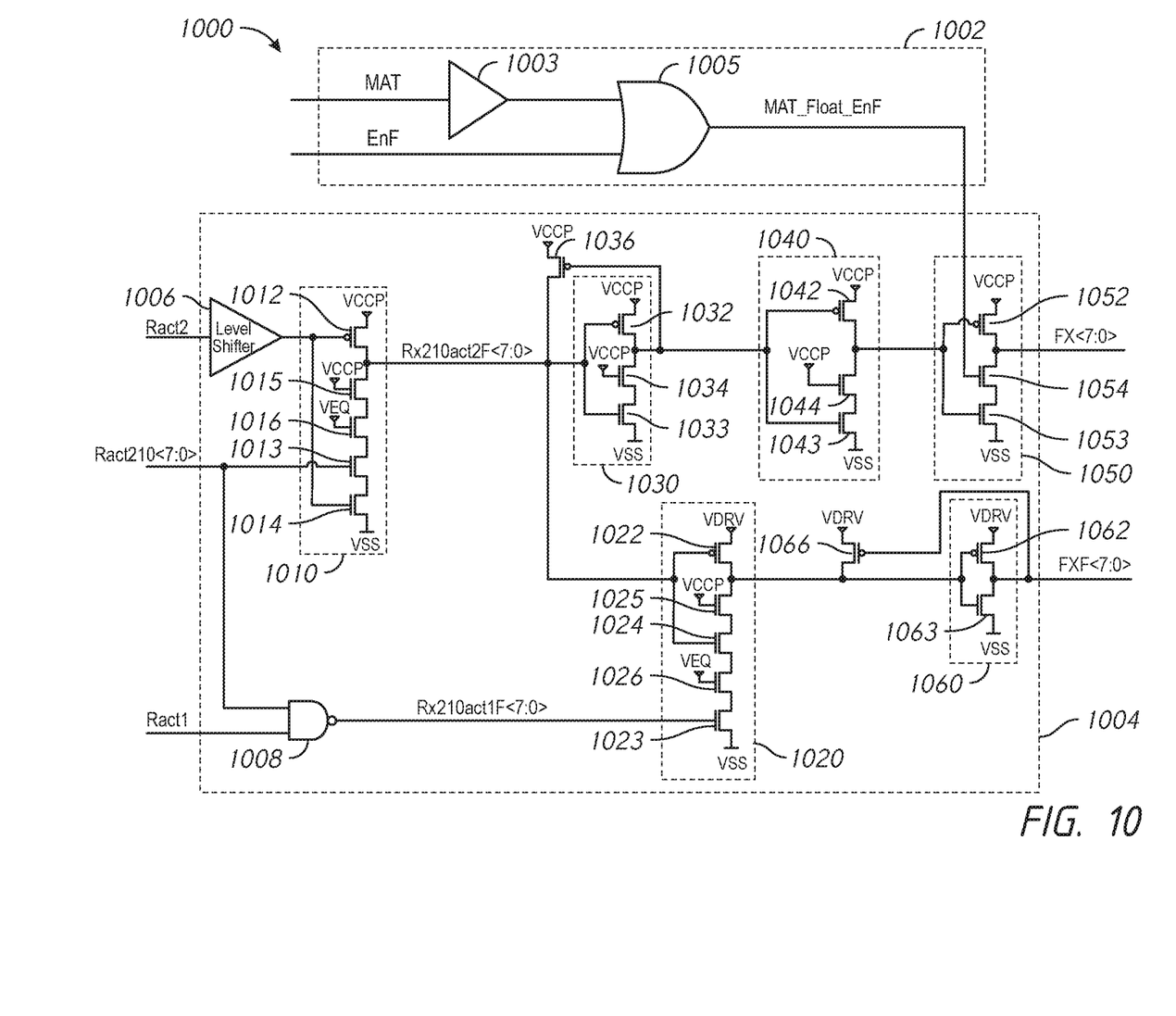
FIG. 10 is a schematic diagram of a driver circuit for driving signals according to an embodiment of the disclosure.

FIG. 10 is a schematic diagram of a driver circuit 1000 for driving signals FX and FXF according to an embodiment of the disclosure. The driver circuit 1000 may be included in a FX driver previously described in various embodiments of the disclosure. For example, a FX driver may include a plurality of driver circuits 1000, each configured to provide respective FX and FXF signals to a subword driver.

The driver circuit 1000 includes a control circuit 1002 and a signal driver circuit 1004. The signal driver circuit 1004 provides driving signals FX and FXF having complementary logic levels responsive to selection signal Ract210 when activated by active control signals Ract1 and Ract2 (e.g., active high logic levels). The selection signal may be provided by a predecoder included in a row decoder. For example, the Ract210 signal may be included in selection signals provided by the predecoder (e.g., selection signals SELFX provided by the predecoder PRE). For example, in some embodiments, the selection signals include eight signals Ract210<7:0>. Each of the Ract210 signals is provided to a respective driver circuit 1000 to provide respective driving signals FX and FXF based on the respective selection signal Ract210 (e.g., Ract210<0> is provided to a respective driver circuit 1000 to provide FX<0> and FXF<0>, Ract210<1> is provided to a respective driver circuit 1000 to provide FX<1> and FXF<1>, Ract210<2> is provided to a respective driver circuit 1000 to provide FX<2> and FXF<2>, and so on). The control signals Ract1 and Ract2 may be commonly provided to the driver circuits 1000.

The FX signal has the same logic level as the Ract210 signal and the FXF signal has a complementary logic level to the Ract210 signal. The control circuit 1002 may control the driver circuit 1000 to provide a FX signal having a floating voltage ("floating FX signal") in a first mode. The floating voltage of the FX signal is generally not forced to a voltage, such as to a power supply potential or an internal potential. A floating FX signal may reduce leakage currents (e.g., GIDL currents) in some operating conditions for circuits that receive the FX signal, such as a subword driver, in comparison to the signal driver circuit 1004 not providing a floating FX signal. The control circuit 102 may control the driver circuit 1000 to provide a FX signal having a voltage pulled high to an internal potential or pulled low to a ground potential in a second mode.

The signal driver circuit 1004 includes a level shifter circuit 1006 that receives a control signal Ract2 and provides a level shifted Ract2 signal to a logic circuit 1010. The level shifter circuit 1006 changes a voltage of at least one of the logic levels for the Ract2 signal. For example, in some embodiments of the disclosure, the level shifter circuit changes the voltages from VPERI to VCCP for a high logic level. The logic circuit 1010 further receives selection signal Ract210. The driver circuit 1000 further includes a logic circuit 1008 that receives a control signal Ract1 and the selection signal Ract210.

The logic circuit 1008 provides a low logic level Rx210*act*1F signal (e.g., at a ground potential VSS) when both the Ract1 signal and a respective Ract210 signal are at a high logic level (e.g., at the internal potential VPERI). The logic circuit 1008 provides a high logic level Rx210*act*1F signal when either or both of the Ract1 signal and the respective Ract210 signal is a low logic level. The logic circuit 1008 may include a NAND logic gate in some embodiments of the disclosure. The logic circuit 1008 may additionally and/or alternatively include other logic gates in other embodiments of the disclosure.

As previously described, the level shifter circuit 1006 provides the level shifted Ract2 signal to the logic circuit 1010. The logic circuit 1010 includes transistors 1012-1015 coupled in series between a power supply providing an internal potential (e.g., VCCP) and a ground potential VSS. The transistors 1012 and 1014 are provided the level shifted Ract2 signal, and transistor 1013 is provided a Ract210 signal (e.g., one of the Ract210 signals). The transistors 1015 and 1016 are coupled to internal potentials (e.g., VCCP, VEQ). The logic circuit 1010 provides a low logic level Rx210*act*2F signal when both the respective Ract210 signal and the level shifted Ract2 signal are high logic levels (e.g., at the VCCP potential), and provides a high logic level Rx210*act*2F signal when the Ract2 signal is a low logic level. The transistors 1015 and 1016 limit a current through the logic circuit 1010 when operating.

The Rx210*act*2F signal is provided by the logic circuit 1010 to a circuit 1030, and in response, provides an output signal to a circuit 1040. The circuit 1030 includes transistors 1032-1034 coupled in series between a power supply providing an internal potential (e.g., VCCP) and a ground potential VSS. The transistors 1032 and 1033 are provided the output signal from the logic circuit 1010. The transistor 1034 is coupled to an internal potential (e.g., VCCP). The circuit 1030 provides an output signal that is the complementary logic level of the signal from the logic circuit 1010. For example, the circuit 1030 provides a low logic level output signal when the signal from the logic circuit 1010 is a high logic level, and the circuit 1030 provides a high logic level output signal when the signal from the logic circuit 1010 is a low logic level. An output of the circuit 1030 is coupled to its input by a transistor 1036, which is further coupled to an internal potential (e.g., VCCP). The transistor 1036 aids in latching a low logic level output signal at the output of the circuit 1030.

As previously described, the circuit 1030 provides its output signal to the circuit 1040. The circuit 1040 includes transistors 1042-1044 coupled in series between a power supply providing an internal potential (e.g., VCCP) and a ground potential VSS. The transistors 1042 and 1043 are provided the output signal from the circuit 1030. The transistor 1044 is coupled to an internal potential (e.g., VCCP). The circuit 1040 provides an output signal that is the complementary logic level of the output signal from the circuit 1030. For example, the circuit 1040 provides a low logic level output signal when the signal from the circuit 1030 is a high logic level, and the circuit 1040 provides a high logic level output signal when the signal from the circuit 1030 is a low logic level.

The output signal from the circuit 1040 is provided to an output circuit 1050. The output circuit 1050 provides the FX signal. The output circuit includes transistors 1052-1054 coupled in series between a power supply providing an internal potential (e.g., VCCP) and a ground potential VSS. The transistors 1052 and 1053 are provided the output signal from the circuit 1040. The transistor 1054 is provided a control signal MAT_Float_EnF provided by the control circuit 1002.

The control circuit 1002 includes a level shifter circuit 1003 that receives a memory mat selection signal MAT and provides a level shifted MAT signal to a logic circuit 1005. The logic circuit 1005 further receives a float enable signal EnF. When the EnF signal is active (e.g., active low logic level), the logic circuit 1005 provides the MAT_Float_EnF signal having a logic level based on the logic level of the MAT signal. For example, when the EnF signal is active, the control circuit 1002 provides a low logic level MAT_Float_EnF signal (e.g., an active MAT_Float_EnF signal) responsive to a low logic level MAT signal, and provides a high logic level MAT_Float_EnF signal (e.g., an inactive MAT_Float_EnF signal) responsive to a high logic level MAT signal. When the EnF signal is inactive (e.g., inactive high logic level), the control circuit 1002 provides a high logic level MAT_Float_EnF signal regardless of the logic level of the MAT signal. An active EnF signal may correspond to a first mode and an inactive EnF signal may correspond to a second mode.

When the MAT_Float_EnF signal is inactive (e.g., inactive high logic level), the output circuit 1050 provides the FX signal having a voltage corresponding to a logic level based on the logic level of the output signal from the circuit 1040. For example, the output circuit 1050 provides the FX signal having a voltage corresponding to a low logic level (e.g., the ground potential) when the output signal from the circuit 1040 is a high logic level, and the output circuit 1050 provides the FX signal having a voltage corresponding to a high logic level (e.g., the VCCP potential) when the output signal from the circuit 1040 is a low logic level. When the MAT_Float_EnF signal is active (e.g., active low logic level), the output circuit 1050 provides a floating FX signal. For example, the output circuit 1050 provides the FX signal having a floating voltage (e.g., no voltage) when the output signal from the circuit 1040 has a high logic level. In such a condition, the FX signal has a voltage that is not forced to the voltage of the VCCP potential or to the ground potential.

With reference to the logic circuit 1010, the Rx210*act*2F signal is also provided to a logic circuit 1020, which also receives a Rx210*act*1F signal from the logic circuit 1008. The logic circuit 1020 includes transistors 1022-1025 coupled in series between a power supply providing an internal potential (e.g., VDRV) and a ground potential VSS. The transistors 1022 and 1024 are provided the Rx210*act*2F signal from the logic circuit 1010 and the transistor 1023 is provided the Rx210*act*1F signal from the logic circuit 1008. The transistors 1025 and 1026 are coupled to internal potentials (e.g., VCCP, VEQ). The logic circuit 1020 provides a low logic level output signal when both the Rx210*act*1F signal and the Rx210*act*2F signal are high logic levels, and provides a high logic level output signal when the Rx210*act*2F signal is a low logic level. The transistors 1025 and 1026 limit a current through the logic circuit 1020 when operating.

The logic circuit 1020 provides the output signal to an output circuit 1060, which provides the FXF signal. The output circuit 1060 includes transistors 1062 and 1063 coupled in series between a power supply providing an internal potential (e.g., VDRV) and a ground potential VSS. The transistors 1062 and 1063 are provided the output signal from the logic circuit 1020. The output circuit 1060 provides the FXF signal having the complementary logic level of the signal from the logic circuit 1020. For example, the output circuit 1060 provides a low logic level FXF signal when the signal from the logic circuit 1020 is a high logic level, and the output circuit 1060 provides a high logic level FXF signal when the signal from the logic circuit 1020 is a low logic level. An output of the output circuit 1060 is coupled to its input by a transistor 1066, which is further coupled to an internal potential (e.g., VDRV). The transistor 1066 aids in latching a low logic level FXF signal at the output of the output circuit 1060.

Figure 11:
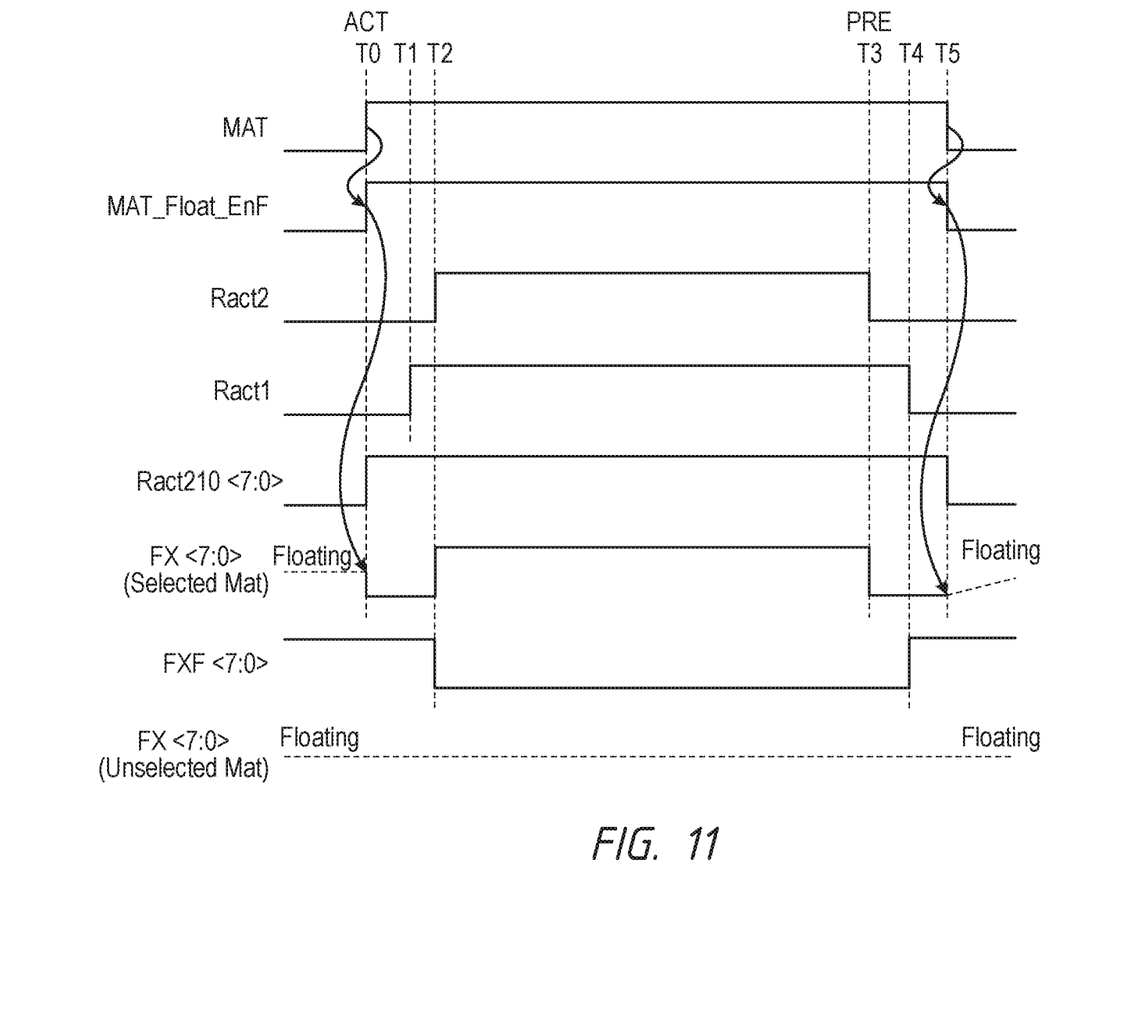
FIG. 11 is a timing diagram of various signals during operation of the driver circuit of FIG. 10 according to an embodiment of the disclosure.

Operation of the driver circuit 1000 will be described with reference to FIG. 11. FIG. 11 is a timing diagram of various signals during operation of the driver circuit 1000 according to an embodiment of the disclosure. The operation of the driver circuit will be described in the context of a selected memory mat, with the other memory mats being unselected.

FIG. 11 shows the selection signals Ract210 provided to the logic circuit 1010 and to the logic circuit 1008. In the example of FIG. 11, the float enable signal EnF is active (e.g., active low logic level). The active float enable signal EnF may correspond to a first mode. As will be described in more detail below, when in the first mode, a floating FX signal is provided to unselected memory mats. In contrast, when in a second mode (e.g., the float enable signal EnF is inactive (inactive high logic level)) an FX signal that is pulled high to an internal potential or pulled low to a ground potential is provided to the word drivers of unselected memory mats. Additionally, activation occurs at time T0 and precharge is initiated at time T3.

Prior to time T0, the memory mats have not been selected, as indicated by a low logic level MAT signal. As previously described, the EnF signal is active, which results in the control circuit 1002 providing a low logic level MAT_Float_EnF signal to the signal driver circuit 1004. The low logic level MAT_Float_EnF signal causes the signal driver circuits 1004 for the Ract210 signals to provide a FX signal having a floating voltage. Thus, the FX signals provided by the signal driver circuits of the memory mat that will be selected later in the example of FIG. 11 are floating. The unselected memory mats remain inactive, as indicated in FIG. 11 by the floating FX signals. The FXF signal provided by the signal driver circuit 1004 is a high logic level due to the low logic level Ract1 signal and the latched high logic level Rx210*act*2F signal at the input of the circuit 1030.

With regards to the floating FX signal, the low logic level MAT_Float_EnF signal causes the transistor 1054 of the output circuit 1050 to be non-conductive, which prevents the output of the output circuit 1050 from being pulled low to the ground potential. The transistor 1052 is also non-conductive because a low logic level output signal from the circuit 1030 is latched by the transistor 1036, and results in a high logic level output signal from the circuit 1040. As a result, the non-conductive transistor 1054 and the non-conductive transistor 1052 prevent the output of the output circuit 1050 from being pulled low to the ground potential or high to the internal potential. Instead, the output of the output circuit 1050 is allowed to float to provide a floating FX signal.

At time T0, a selected memory mat is activated, as indicated by the MAT signal changing to a high logic level. The unselected memory mats remain inactive, as indicated in FIG. 11 by the continued floating FX signals. The high logic level MAT signal causes the control circuit 1002 to provide a high logic level MAT_Float_EnF signal to the signal driver circuits of the selected memory mat. The high logic level MAT_Float_EnF signal causes the transistor 1054 of the output circuit 1050 to be conductive, which allows the output of the output circuit 1050 to be pulled high to the internal potential or low to the ground potential based on the logic level of the output signal provided by the circuit 1040. For example, as shown in the example of FIG. 11, the transistor 1053 becomes conductive to pull the output of the output circuit 1050 low to the ground potential.

At time T1 the Ract1 signal becomes active to cause the logic circuit 1008 to provide the Rx210*act*1F signal having a complementary logic level of the Ract210 signal. At time T2, the Ract2 signal becomes active to cause the logic circuit 1010 to provide the Rx210*act*2F signal having a logic level based on the logic level of the Ract210 signal. In the example of FIG. 11, the Ract210 signal is shown to have a high logic level, which results in a low logic level Rx210*act*2F signal. A high logic level Ract210 signal indicates that the corresponding subword line is selected and should be driven to an active voltage. The low logic level Rx210*act*2F signal causes the output of the output circuit 1050 to be pulled high to the internal potential to provide a high logic level FX signal, and causes the output of the output circuit 1060 to be pulled low to the ground potential to provide a low logic level FXF signal, as illustrated in FIG. 11. Although not shown in FIG. 11, when a low logic level Ract210 signal is provided to the signal driver circuit 1004, the Rx210*act*2F signal has a high logic level. A low logic level Ract210 signal indicates that the corresponding subword line is not selected and should be driven to an inactive voltage. The high logic level Rx210*act*2F signal causes the output of the output circuit 1050 to be pulled low to the ground potential to provide a low logic level FX signal, and causes the output of the output circuit 1060 to be pulled high to the internal potential to provide a high logic level FXF signal.

The FX and FXF signals may be provided to subword drivers in some embodiments of the disclosure to selectively drive respective subword lines, as previously discussed. As further shown in FIG. 11, the FX signal provided by the driver circuits 1000 of unselected memory mats remain floating.

At time T3, a precharge operation to the selected memory mat is initiated. The Ract2 signal becomes inactive, which causes the logic circuit 1010 to provide a high logic level Rx210*act*2F signal regardless of the logic level of the Ract210 signal. The high logic level Rx210*act*2F signal causes the output of the output circuit 1050 to be pulled low to the ground potential to provide a low logic level FX signal. At time T4, the Ract1 signal becomes inactive, which causes the logic circuit 1008 to provide a high logic level Rx210*act*1F signal regardless of the logic level of the Ract210 signal. The high logic level Rx210*act*1F signal, along with the a high logic level Rx210*act*2F signal, causes the output of the output circuit 1060 to be pulled high to the internal potential to provide a high logic level FXF signal.

At time T5, the selected memory mat becomes inactive as indicated by the MAT signal changing to a low logic level. The low logic level MAT signal causes the control circuit 1002 to provide a low logic level MAT_Float_EnF signal to the signal driver circuit 1004 of the formerly selected memory mat. The transistor 1054 of the output circuit 1050 becomes non-conductive due to the low logic level MAT_Float_EnF signal, and the high logic level Rx210*act*2F signal (as previously discussed with reference to time T4) causes the transistor 1052 of the output circuit 1050 to be non-conductive. As a result, the non-conductive transistor 1052 and the non-conductive transistor 1054 prevent the output of the output circuit 1050 to be pulled high to the internal potential or low to the ground potential. Instead, the output of the output circuit 1050 is allowed to float to provide a floating FX signal.

In the example of FIG. 11, the Ract210 signal is shown having a high logic level. It will be appreciated, however, that the Ract210 signal may also have a low logic level. For example, some Ract210 signals of the selection signals (e.g., Ract210<7:0> may have low logic levels and the respective signal driver circuits provide low logic level FX signals (and high logic level FXF signals) and other Ract210 signals of the selection signals may have high logic levels and the respective signal driver circuits provide high logic level FX signals (and low logic level FXF signals).

The floating voltage of the FX signal prior to time T0 and following time T5 in the example of FIG. 5 may reduce leakage currents compared to the signal driver circuit 1004 providing a FX signal having a voltage corresponding to, for example, a ground potential. For example, a floating FX signal provided to the subword drivers of unselected memory mats may reduce leakage currents in circuits of the subword drivers. In such a case, a low logic level FX signal may cause leakage currents in circuits that are provided the FX signal (e.g., subword drivers). However, by providing a FX signal having a floating voltage the condition for causing leakage currents may be mitigated, which in turn, may reduce leakage currents.

The voltage level of the floating FX signal may be based on various factors, for example, transistor characteristics of the transistors included in the output circuit 1050, the voltage of the internal potentials (e.g., VCCP, VDRV, etc.), leakage currents and impedances of the various circuits, etc. In some embodiments of the disclosure, the voltage of the floating FX signal may be greater than the ground potential. In some embodiments of the disclosure, the voltage of the floating FX signal is greater than the internal potential provided to the output circuit 1060 (e.g., VDRV). In some embodiments of the disclosure, the voltage of the floating FX signal is greater than the internal potential provided to the output circuit 1060, but less than the internal potential provided to the output circuit 1050 (e.g., VCCP).

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
   a word line driver configured to be coupled to a plurality of word lines of a plurality of memory cell mats to provide a selected word line of the plurality of word lines with a high voltage and to provide one or more unselected word lines of a selected memory cell mat of the plurality of memory cell mats with a low voltage; and
   a control circuit configured to receive a float enable signal and a memory mat activation signal, and further configured to provide an active enable signal to the word line driver responsive to an active float enable signal and an inactive memory mat activation signal, to cause the word line driver to provide no voltage.

2. The apparatus of claim 1, wherein the word line driver is further configured, responsive to a precharge command, to provide no voltage to the selected word line and the unselected word lines of the selected memory cell mat of the plurality of memory cell mats.

3. The apparatus of claim 2, wherein the word line driver is further configured, responsive to the precharge command, to provide the low voltage to the selected word line of the plurality of word lines of the selected memory cell mat of the plurality of memory cell mats before providing no voltage to the selected word line of the plurality of word lines of the selected memory cell mat of the plurality of memory cell mats.

4. The apparatus of claim 1, wherein the word line driver is further configured, responsive to a row active command, to provide the low voltage to the selected word line of the plurality of word lines of the selected memory cell mat of the plurality of memory cell mats before providing the high voltage to the selected word line of the plurality of word lines of the selected memory cell mat of the plurality of memory cell mats.

5. The apparatus of claim 1, wherein the word line driver is configured to:
responsive to a row active command in a first operation mode:
provide the selected word line of the plurality of word lines with the high voltage;
provide the unselected word lines of a selected memory cell mat of the plurality of memory cell mats with the low voltage; and
provide one or more word lines of each of unselected memory cell mats of the plurality of memory cell mats with no voltage; and
responsive to the row active command in a second operation mode:
provide the selected word line of the plurality of word lines with the high voltage;
provide the unselected word lines of a selected memory cell mat of the plurality of memory cell mats with the low voltage; and
provide the word lines of each of the unselected memory cell mats of the plurality of memory cell mats with the low voltage.

6. The apparatus of claim 1, wherein the word line driver comprises an output circuit coupled between a first voltage line having the high voltage and a second voltage line having the low voltage, and configured to be non-conductive to at least the first voltage line or the second voltage line responsive to the active float enable signal.

7. An apparatus comprising:
a memory mat including a main word line and a plurality of subword lines;
a plurality of subword drivers coupled to the main word line of the memory mat, each subword driver of the plurality of subword drivers coupled to a respective one of the plurality of subword lines of the memory mat and drive the respective one of the plurality of subword lines to a voltage responsive to a respective driving signal; and
a signal driver circuit configured to provide the respective driving signal having a first voltage or a second voltage responsive to a selection signal, and further configured to provide the respective driving signal having a floating voltage responsive to an active enable signal; and
a control circuit configured to receive a float enable signal and a memory mat activation signal, and further configured to provide the active enable signal to the signal driver circuit responsive to an active float enable signal and inactive memory mat activation signal.

8. The apparatus of claim 7, wherein the signal driver circuit comprises an output circuit coupled between a first voltage line having the first voltage and a second voltage line having the second voltage, and configured to be non-conductive to at least the first voltage line or the second voltage line responsive to the active float enable signal.

9. The apparatus of claim 8, wherein the output circuit of the signal driver circuit comprises:
a first transistor configured to be provided the first voltage and to provide the first voltage to an output when activated;
a second transistor configured to be provided the second voltage and to provide the second voltage when activated; and
a third transistor coupled between the second transistor and the output and configured to provide the second voltage to the output when activated and to allow the output to float when not activated responsive to the float enable signal.

10. The apparatus of claim 9, wherein the signal driver circuit further comprises a second output circuit configured to provide a complementary driving signal.

11. The apparatus of claim 7, wherein the signal driver circuit is configured to receive first and second control signals, wherein the signal driver circuit is further configured to provide the respective driving signal having a voltage responsive to a logic level of a selection signal when the first and second control signals are active and to provide the respective driving signal having the second voltage when the first control signal is inactive.

12. The apparatus of claim 7, wherein a subword driver of the plurality of subword drivers comprises:
first and second transistors series coupled and coupled to the main word line, the first transistor configured to be provided the respective driving signal; and
a third transistor coupled to a common node of the first and second transistors.

13. The apparatus of claim 7, wherein the memory mat includes a plurality of memory cell array regions and wherein the main word line extends across the plurality of memory cell array regions.

14. The apparatus of claim 13, wherein the plurality of memory cell array regions of the memory mat are arranged two array regions wide.

15. The apparatus of claim 13, wherein the memory cell array regions of the memory mat are arranged one array region wide.

16. A method comprising:
driving a word line driver of a selected word line of a selected memory mat of a plurality of memory mats to a first voltage;
driving one or more word line drivers of respective unselected word lines of the selected memory mat of the plurality of memory mats to a second voltage;
receiving a float enable signal and a memory mat activation signal; and
providing an active enable signal to the word line driver responsive to an active float enable signal and an inactive memory mat activation signal, to cause one or more word line drivers of unselected memory mats of the plurality of memory mats to provide no voltage.

17. The method of claim 16, wherein driving the word line driver for the selected word line of the selected memory mat comprises providing an internal potential having a first voltage to the word line driver.

18. The method of claim 16 further comprising activating the word line drivers of the selected memory mat of the plurality of memory mats.

19. The method of claim 16 further comprising providing a floating voltage to word line drivers of the selected memory mat of the plurality of memory mats prior to activation of the selected memory mat of the plurality of memory mats and subsequent to deactivation of the selected memory mat of the plurality of memory mats.

20. The method of claim 16, wherein causing the word line drivers of unselected memory mats of the plurality of memory mats to provide no voltage comprises deactivating a transistor in an output circuit to provide the first voltage to the word line drivers for the unselected word lines of the selected memory mat of the plurality of memory mats.

* * * * *